US012677435B2

(12) United States Patent
Cha et al.

(10) Patent No.: US 12,677,435 B2
(45) Date of Patent: Jul. 7, 2026

(54) CO-INTEGRATED RESONANT TUNNELING DIODE AND HIGH-ELECTRON MOBILITY TRANSISTOR

(71) Applicant: International Business Machines Corporation, Armonk, NY (US)

(72) Inventors: Eunjung Cha, Zurich (CH); Bogdan Cezar Zota, Rueschlikon (CH); Kirsten Emilie Moselund, Rüschlikon (CH); Katarzyna Hnida-Gut, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 567 days.

(21) Appl. No.: 17/714,260

(22) Filed: Apr. 6, 2022

(65) Prior Publication Data

US 2023/0327008 A1    Oct. 12, 2023

(51) Int. Cl.
H10D 30/47        (2025.01)
H10D 8/01        (2025.01)
(Continued)

(52) U.S. Cl.
CPC ......... H10D 30/4732 (2025.01); H10D 8/053 (2025.01); H10D 8/755 (2025.01);
(Continued)

(58) Field of Classification Search
CPC ............... H01L 29/7783; H01L 29/152; H01L 29/66151; H01L 29/66462; H01L 29/882;
(Continued)

(56) References Cited

U.S. PATENT DOCUMENTS 5,294,564 A        3/1994  Karapiperis et al.
5,416,040 A  *   5/1995  Beam, III ............ H10D 62/149
                                                    257/E27.098
(Continued)

FOREIGN PATENT DOCUMENTS

CN        101064275 A  *  10/2007
CN        100495682 C  *  6/2009
(Continued)

OTHER PUBLICATIONS

B. L. Frescura, R. Rusert and J. Schroeder, "Mesa isolation—An isolation technique for integrated circuits," 1966 International Electron Devices Meeting, Washington, DC, USA, 1966, pp. 66-68, doi: 10.1109/IEDM.1966.187691 (Year: 1966).*
(Continued)

*Primary Examiner* — Christine S. Kim
*Assistant Examiner* — Sesha Sairaman Srinivasan
(74) *Attorney, Agent, or Firm* — Amin, Turocy & Watson, LLP

(57) ABSTRACT

One or more devices and/or methods provided herein relate to a method for fabricating a semiconductor device having a co-integrated RTD and HEMT. A semiconductor device can comprise an RTD and an HEMT that are co-integrated along a substrate. A fabrication method can comprise providing a heterostructure comprising a plurality of transistor layers of an HEMT, forming on the vertical stack a template structure comprising an opening, a cavity and a seed structure, the seed structure comprising a seed material and a seed surface, and growing a plurality of diode layers of an RTD within the cavity of the template structure from the seed surface, wherein the RTD and HEMT are co-integrated along a substrate.

20 Claims, 10 Drawing Sheets

(51) Int. Cl.

| | | |
|---|---|---|
| *H10D 8/75* | (2025.01) | |
| *H10D 30/01* | (2025.01) | |
| *H10D 62/10* | (2025.01) | |
| *H10D 62/81* | (2025.01) | |
| *H10D 62/815* | (2025.01) | |
| *H10D 84/01* | (2026.01) | |
| *H10D 84/05* | (2025.01) | |
| *H10D 84/80* | (2025.01) | |
| *H10W 40/30* | (2026.01) | |

(52) U.S. Cl.
CPC ....... *H10D 30/015* (2025.01); *H10D 62/8162* (2025.01); *H10W 40/305* (2026.01)

(58) Field of Classification Search
CPC . H01L 23/445; H01L 29/122; H01L 29/0653; H01L 27/0605; H01L 27/0629; H01L 27/0727; H01L 21/8252; H10D 30/4732; H10D 8/053; H10D 8/755; H10D 30/015; H10D 62/8162; H10D 62/812; H10D 84/0107; H10D 62/116; H10D 84/811; H10D 84/05; H10W 40/305
See application file for complete search history.

(56) References Cited

U.S. PATENT DOCUMENTS

| | | | | |
|---|---|---|---|---|
| 5,534,714 | A | 7/1996 | Beam, III et al. | |
| 6,294,412 | B1 | 9/2001 | Krivokapic | |
| 6,490,193 | B1 * | 12/2002 | van der Wagt | G11C 11/38 |
| | | | | 365/175 |
| 9,117,753 | B2 | 8/2015 | Egard et al. | |
| 9,608,567 | B2 | 3/2017 | Egard et al. | |
| 9,923,049 | B2 | 3/2018 | Okamoto | |
| 10,090,043 | B2 | 10/2018 | Frank | |
| 2008/0073641 | A1 * | 3/2008 | Cheng | G11C 11/161 |
| | | | | 438/237 |
| 2016/0094183 | A1 | 3/2016 | Ochi et al. | |
| 2016/0218201 | A1 * | 7/2016 | Okamoto | H10D 8/755 |
| 2017/0117138 | A1 | 4/2017 | Xiao et al. | |
| 2017/0365660 | A1 | 12/2017 | Borg et al. | |
| 2018/0075901 | A1 | 3/2018 | Frank | |
| 2019/0013066 | A1 | 1/2019 | Frank | |
| 2019/0051656 | A1 * | 2/2019 | Carlson | H10B 43/27 |
| 2019/0096879 | A1 * | 3/2019 | Chen | H10D 84/811 |
| 2021/0257969 | A1 * | 8/2021 | Bardin | H03D 7/1458 |

FOREIGN PATENT DOCUMENTS

| | | |
|---|---|---|
| CN | 101692438 A | 4/2010 |
| CN | 112236785 A | 1/2021 |

OTHER PUBLICATIONS

B. L. Frescura, R. Rusert and J. Schroeder, "Mesa isolation—An isolation technique for integrated circuits," 1966 International Electron Devices Meeting, Washington, DC, USA, 1966, pp. 66-68, doi: 10.1109/IEDM.1966.187691 (Year: 1966) (Year: 1966).*

Nakasha et al., A W-band Wavelet Generator Using O.13-~m InP HEMTs for Multigigabit Communications Based on Ultra-Wideband Impulse Radio, IEEE MTT-S International Microwave Symposium Digest, p. 109-112, 2008, 4 pgs.

Ohlsson et al., Picosecond dynamics in a millimetre-wave RTD-MOSFET wavelet generator, Electronics Letters, vol. 51 No. 21 p. 1671-1673, 2015, 2 pgs.

Haung et al., Resonant Tunnelling Diodes and High Electron Mobility Transistors Integratedon GaAs Substrates, Chin.Phys. Lett., vol. 23, No. 3, p. 697-700, 2006, 5 pgs.

Ekanayake et al., Qubit Control-Pulse Generator Circuits for Operation at Cryogenic Temperatures, 8th IEEE Conference on Nanotechnology, p. 472-475, 2008, 4 pgs.

Haitao et al., InP-Based RTD/HEMT Monolithic Integration, Trans. Tianjin Univ. 16, p. 267-269, 2010, 3 pgs.

Terayama et al., Fluoride Resonant Tunneling Diodes Co-integrated with Si-MOSFETs, Japanese Journal of Applied Physics, 2002, 3 pgs.

Egard et al., In0.53Ga0.47As RTD-MOSFET Millimeter-Wave Wavelet Generator, IEEE Electron Device Letters, vol. 33, No. 7, 2012, 5 pgs.

List of IBM Patents and Patent Applications Treated as Related.

Mell et al., "The NIST Definition of Cloud Computing," Recommendations of the National Institute of Standards and Technology, NIST Special Publication 800-145, Sep. 2011, 7 pages.

International Search Report and Written Opinion received for PCT Application Serial No. PCT/IB2023/052849 dated Jun. 26, 2023, 15 pages.

Egard et al., "Frequency Modulation in mm-Wave InGaAs MOSFET/RTD Wavelet Generators", IPRM, May 19-23, 2013, 2 pages.

Jazaeri et al., "A Review on Quantum Computing: From Qubits to Front-end Electronics and Cryogenic MOSFET Physics", Quantam Physics, Aug. 7, 2019, 12 pages.

Broekaert et al., "Functional InP/InGaAs Lateral Double Barrier Heterostructure Resonant Tunneling Diodes by Using Etch and Regrowth", Applied Physics Letters, vol. 69, Sep. 23, 1996, 4 pages.

International Search Report and Written Opinion received for PCT Application Serial No. PCT/IB2023/052564 dated Jun. 22, 2023, 16 pages.

Chen et al., "Device Technology for Monolithic Integration of Inp-based Resonant Tunneling Diodes and Hemts", IEICE Transactions on Electronics, vol. E79, No. 11, Nov. 1996, 11 pages.

Terayama et al. "Fluoride Resonant Tunneling Diodes Co-integrated with Si-MOSFETs.", Japanese Journal of Applied Physics, vol. 41, 2002, pp. 2598-2601.

United States Non-Final Rejection dated Oct. 1, 2024, 11 pages, in U.S. Appl. No. 17/714,267.

Final Rejection Mailed on Feb. 21, 2025 for U.S. Appl. No. 17/714,267, 12 page(s).

Notice of Allowance and Fees Due (PTOL-85) Mailed on May 8, 2025 for U.S. Appl. No. 17/714,267, 10 page(s).

Brunelli et al., "Horizontal Heterojunction Integration via Template-Assisted Selective Epitaxy", Crystal Growth & Design, 2019, 19 pp. 7030-7035.

* cited by examiner

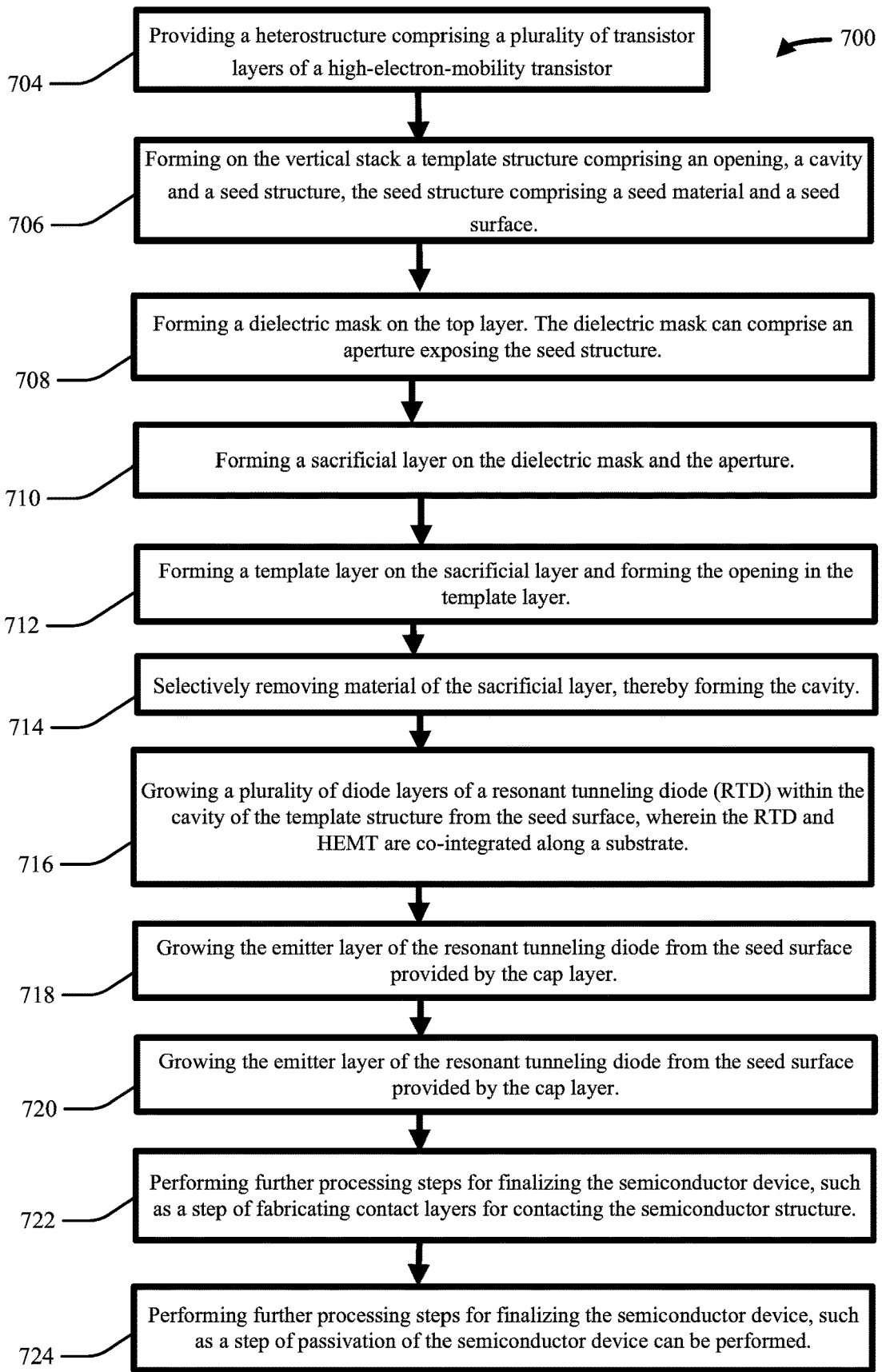

700

704 — Providing a heterostructure comprising a plurality of transistor layers of a high-electron-mobility transistor 706 — Forming on the vertical stack a template structure comprising an opening, a cavity and a seed structure, the seed structure comprising a seed material and a seed surface.

708 — Forming a dielectric mask on the top layer. The dielectric mask can comprise an aperture exposing the seed structure.

710 — Forming a sacrificial layer on the dielectric mask and the aperture.

712 — Forming a template layer on the sacrificial layer and forming the opening in the template layer.

714 — Selectively removing material of the sacrificial layer, thereby forming the cavity.

716 — Growing a plurality of diode layers of a resonant tunneling diode (RTD) within the cavity of the template structure from the seed surface, wherein the RTD and HEMT are co-integrated along a substrate.

718 — Growing the emitter layer of the resonant tunneling diode from the seed surface provided by the cap layer.

720 — Growing the emitter layer of the resonant tunneling diode from the seed surface provided by the cap layer.

722 — Performing further processing steps for finalizing the semiconductor device, such as a step of fabricating contact layers for contacting the semiconductor structure.

724 — Performing further processing steps for finalizing the semiconductor device, such as a step of passivation of the semiconductor device can be performed.

FIG. 7

CO-INTEGRATED RESONANT TUNNELING DIODE AND HIGH-ELECTRON MOBILITY TRANSISTOR

FIELD OF THE INVENTION

The present disclosure relates generally to semiconductors, and more specifically to a semiconductor device comprising a resonant tunneling diode and a high-electron-mobility transistor.

BACKGROUND

In quantum computing systems, radar applications and/or other signal-based applications, semiconductor devices can be employed as or can be comprised by signal generators, such as pulse generators, waveform generators and/or the like.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to manufacture a semiconductor device for generating a waveform, pulse or signal. In the quantum computing space, one or more embodiments described herein can facilitate a process to generate a pulse affecting a state and/or facilitating readout of a state of a qubit.

In accordance with one or more embodiments, a semiconductor device can comprise a resonant tunneling diode and a high-electron-mobility transistor that are co-integrated along a substrate.

In one or more embodiments, the semiconductor device can be comprised by a quantum computer having a cryostat, wherein the semiconductor device can be arranged inside the cryostat within a cryogenic environment.

In accordance with another embodiment, a method for fabricating a semiconductor device can comprise providing a heterostructure comprising a plurality of transistor layers of an HEMT, forming on the vertical stack a template structure comprising an opening, a cavity and a seed structure, the seed structure comprising a seed material and a seed surface, and growing a plurality of diode layers of an RTD within the cavity of the template structure from the seed surface, wherein the RTD and HEMT are co-integrated along a substrate.

In one or more embodiments, the plurality of diode layers of the RTD can be sequentially grown within the cavity.

An advantage of the aforementioned device, system and/or method can be an ability to closely co-integrate RTD and HEMT layers relative to one another, with the layers of each section (RTD section and HEMT section) being arranged in a stacked arrangement, such as vertically-stacked arrangement, relative to one another. Likewise a co-integrated, shared layer can comprise at least one layer of the RTD arranged next to at least one layer of the HEMT, along a direction along the substrate, thus providing a laterally-stacked arrangement.

DESCRIPTION OF THE DRAWINGS

FIG. 7 illustrates a flow diagram of an example method of fabrication of a semiconductor device, in accordance with one or more embodiments described herein.

DETAILED DESCRIPTION

Figure 1:
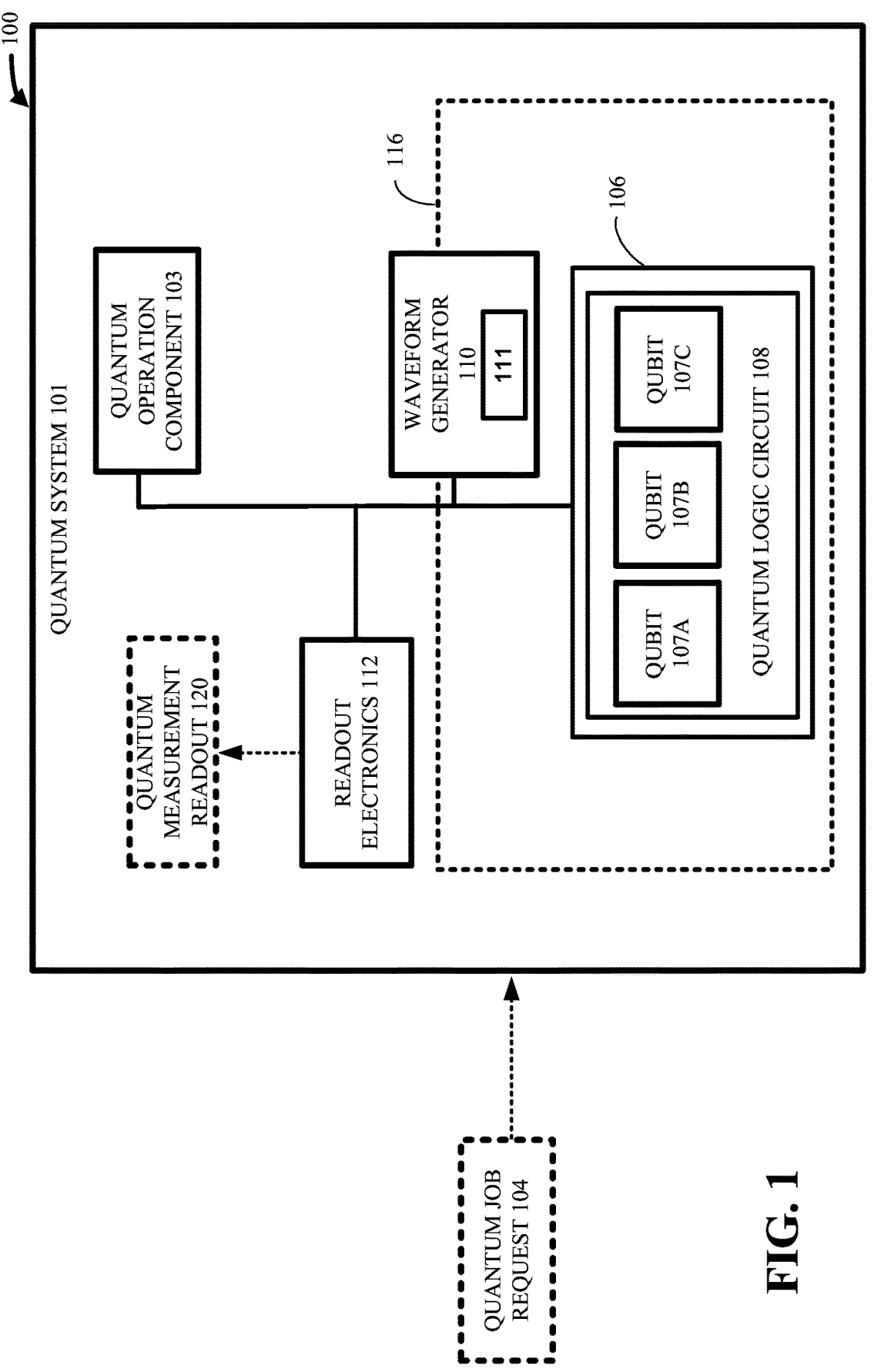
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

Discussion is provided herein relative to a semiconductor for use in a quantum system, such as for use as or comprised by an arbitrary wave form generator of a quantum system. However, semiconductors described and discussed herein can be employed for other uses, such as for radio, radar and/or other signal-based applications. Description and discussion herein is therefore not limited to use in a quantum system or in the quantum space only.

According to one or more embodiments, a semiconductor device described herein can be configured to generate high-frequency pulses, such as wavelets, as qubit control pulses for a quantum computer. High-frequency can refer here to frequencies above 1 gigahertz (GHz). According to one or more embodiments, a semiconductor device described herein can be used for radar applications.

As used herein, a quantum circuit can be a set of operations, such as gates, performed on a set of real-world physical qubits with the purpose of obtaining one or more qubit measurements. A quantum processor can comprise the one or more real-world physical qubits. Operation of a quantum circuit can be facilitated, such as by a waveform generator, to produce one or more physical pulses and/or other waveforms, signals and/or frequencies to alter one or more states of one or more of the physical qubits. The altered states can be measured, thus allowing for one or more computations to be performed regarding the qubits and/or the respective altered states. The waveform generator can be controlled, such as by a respective control stage.

In current quantum computers, a respective control stage can be difficult to scale due to use of bulky room temperature equipment. For example, a 70-qubit system can employ approximately 240 arbitrary wave form generators, which each can be a bulky piece of equipment. Cabling likewise can limit scalability, such as where each qubit can employ an individual control line to the room temperature environment outside of a cryostat of the quantum computer.

Also in current quantum computers, cryogenic qubit control integrated circuits (ICs) can be based on silicon complementary metal oxide semiconductor technology (Si CMOS technology). Such technology can be limiting relative to minimum power dissipation with which the ICs can operate. That is, when qubit numbers scale upward, power per channel also can scale upward, and can be too great to dissipate conventionally.

In one or more embodiments, a qubit can be driven to an excited state, and thus controlled, such as by an arbitrary waveform generation of about 50 nanosecond (ns) pulses at around 6 gigahertz (GHz). In conventional quantum systems, such pulses can be generated using digital to analog converters (DACs) in CMOS technology, both in room temperature systems and in cryogenic IC s.

Turning now to the one or more embodiments described herein, such embodiments relate to a semiconductor device, quantum computer comprising a semiconductor device and/or method for fabricating a semiconductor device that can address one or more deficiencies of existing semiconductor technologies, such as relative to signal generation. That is, such semiconductor device can be employed by a waveform generator of a quantum system to generate one or more signals, waveforms and/or the like to affect a qubit of a quantum logic circuit (e.g., having one or more qubits). The one or more signals can be employed to drive excitation of a qubit, change a state of a qubit and/or to read out a state of a qubit, among other suitable purposes.

Generally, a semiconductor device described herein can comprise a co-integrated resonant tunneling diode (RTD) and high-electron-mobility transistor (HEMT), such as a high-frequency HEMT. In one or more embodiments, the HEMT can be an indium phosphide (InP) HEMT. Such semiconductor device can generate qubit control pulses (e.g., as a wavelet generator) within standard specifications, and at a reduced power, thus also employing less power dissipation. The aforementioned combination of elements can be co-integrated along the substrate, which can allow for flow between the RTD and HEMT along the substrate. As used herein, flow can be signal flow, electric flow, current flow, power flow and/or the like.

In one or more embodiments, the RTD and HEMT can be arranged stacked atop one another, in a direction outwardly from the substrate, in a vertical stack. In one or more embodiments (e.g., FIG. 5b), the aforementioned combination of elements (and/or layers thereof) can additionally be arranged next to one another, in a direction along the substrate. This arrangement of at least an element of the RTD being disposed next to at least an element of the HEMT, along the substrate, can be referred to herein as a lateral stack.

Advantageously, such semiconductor device can provide power efficiency benefits. For example, such semiconductor device can employ less power than a conventional arbitrary waveform generator (AWG) to generate a control pulse for a qubit, such as employing about $10^4$ or even about $10^5$ lower power than a conventional AWG. Such semiconductor device can employ less power than a conventional Si CMOS solution to generate a control pulse for a qubit, such as employing about 5 times to about 10 times lower power than a conventional Si CMOS solution. Such benefits can be given due to the need for fewer active transistors in an analog signal generation scheme such as using RTDs, compared to a digital signal generation scheme using CMOS. Such benefits can be further improved by a tight co-integration on a chip level between the RTD and HEMT (e.g., indium phosphide HEMT) elements.

In addition, the RTD structure can be grown directly on a HEMT heterostructure, such as an InP heterostructure, as will be described in detail below. That is, fabrication can be made more efficient where a single growth step can be employed for the RTD structure.

As used herein, a high-electron mobility transistor (HEMT) can be defined as a field-effect transistor comprising a junction between two materials with different band gaps as the channel. Such a junction can be denoted as a heterojunction and a structure comprising such a junction can be denoted as heterostructure. A high-electron-mobility transistor (HEMT) also can be denoted as heterostructure FET (HFET) or modulation-doped FET (MODFET).

As used herein, the term "on" and "above" can be used in a context, as is customary, to indicate orientation or relative position in a vertical or orthogonal direction to the surface of the substrate, for example in a vertical z-direction.

As used herein, the term(s) "lateral" and/or "laterally" can be used, as is customary, to indicate orientation generally parallel to the plane of the substrate, as opposed to generally vertically, or outwardly, from the substrate surface.

As used herein, the term(s) "vertical" and/or "vertically" can be used, as is customary, to indicate orientation generally orthogonal (e.g., vertical z-direction) to the plane of the substrate, and thus also in a direction outward from the plane of the substrate, as opposed to generally laterally along the substrate surface.

As used herein, the term(s) "arranged on/at a/the semiconductor substrate" can be understood in a broad sense and shall include embodiments according to which an intermediate layer, such as an insulating layer, can be arranged between the substrate and the respectively described layer/structure. Hence the terms "arranged on the substrate" and/or "arranged at the substrate" can comprise the meaning arranged "above the substrate".

Semiconductor devices according to one or more embodiments described herein can be integrated on Si or another substrate, for example a substrate comprising a group III-V semiconductor material.

As used herein, the term group III-V semiconductor material can be understood as a semiconductor material comprising a group III element and a group V element. As used herein, the term "group" can be replaced with "periodic group", or vice versa.

In one or more embodiments, the periodic group III-V semiconductor materials can comprise undoped and/or doped indium gallium arsenide (InGaAs), aluminum arsenide (AlAs), gallium arsenide (GaAs), indium arsenide (InAs) and/or indium phosphide (InP).

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning first generally to FIG. 1, one or more embodiments described herein can include one or more devices, systems and/or apparatuses that can facilitate executing one or more operations to facilitate generation of one or more qubit drive, excitation and/or readout pulses (e.g., signals, waveforms, wavelets and/or the like). FIG. 1 illustrates a block diagram of an example, non-limiting system 100 that facilitate operation of a quantum circuit such as by employing a semiconductor device according to the present disclosure as a waveform generator and/or as an element of a waveform generator of a quantum system.

The following/aforementioned description(s) refer(s) to the operation of a single quantum program from a single quantum job request. This operation can include one or more readouts from cryogenic environment electronics within cryogenic chamber 116 by room temperature control/readout electronics 112 external to the cryogenic chamber 116. That is, one or more of the processes described herein can be scalable, also such as including additionally, and/or alternatively, execution of one or more quantum programs and/or quantum job requests in parallel with one another. Scalability of efficient readout can be enabled by employing semiconductor devices 111 in quantity.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLU-ETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

In one or more other embodiments, the classical system can provide a quantum job request 104, qubit mapping, quantum circuit to be executed and/or the like. Such classical system can analyze the one or more quantum measurement readouts 120. Further, such classical system can manage a queueing of quantum circuits to be operated on the one or more qubits of the quantum logic circuit of a respective quantum system 101.

Figure 8:
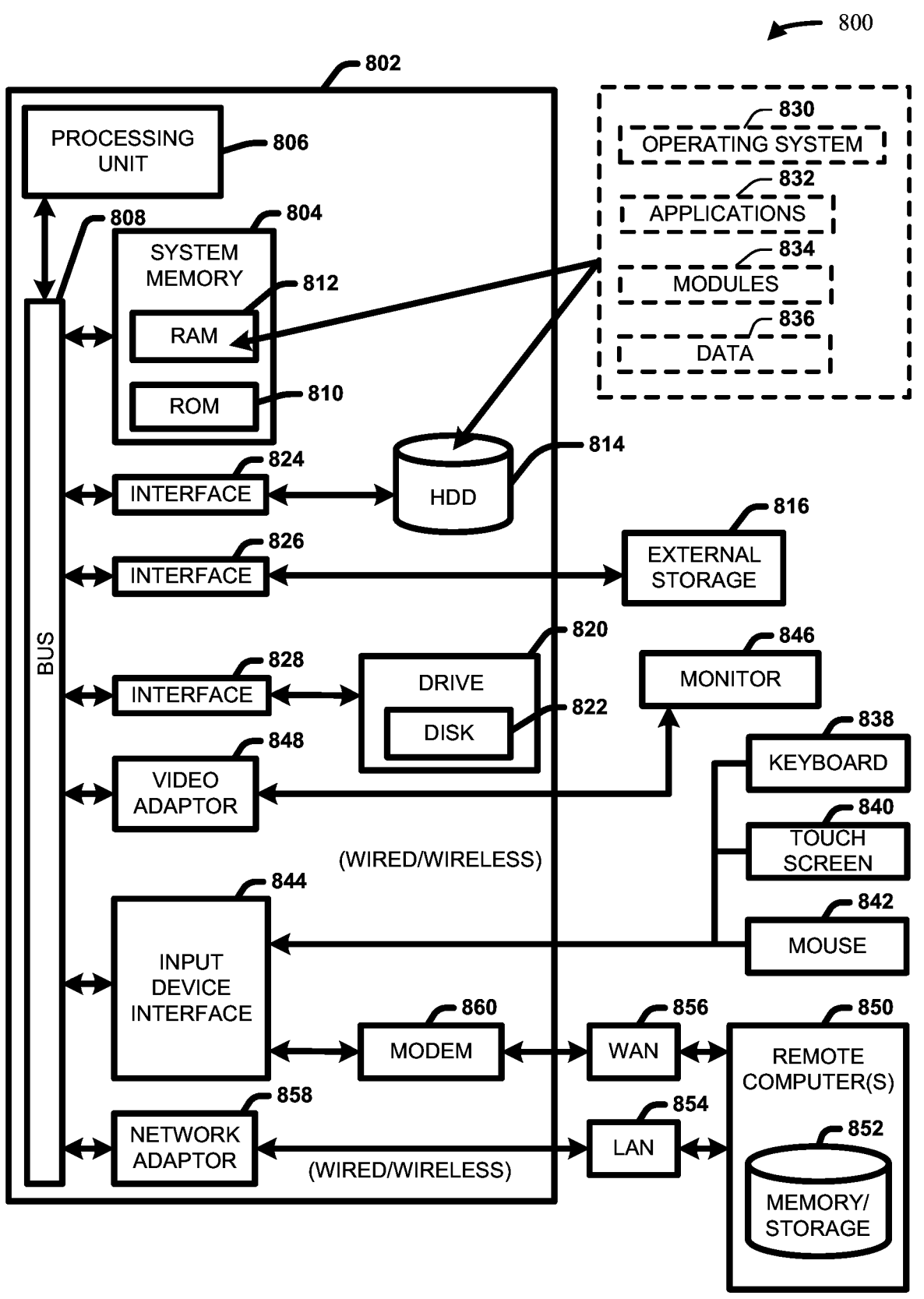
FIG. 8 illustrates a block diagram of an example, non-limiting, operating environment in which one or more embodiments described herein can be facilitated.

For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics 112, a waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more waveform for operating and/or affecting one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. The waveform generator 110 can comprise one or more semiconductor devices 111 having a respective closely co-integrated resonant tunneling diode (RTD) and high-electron-mobility transistor (HEMT). This co-integration can provide for flow along a respective substrate and/or base surface (e.g., where the substrate is removed from, if the substrate is removed) between the RTD and HEMT.

Employing the semiconductor device 111, such as a semiconductor chip, the waveform generator 110 can generate a qubit control pulse employing low power, such as less than 1 mW/qubit. In quantity, the power employed by such semiconductor devices can more readily be cooled by a cooling system (e.g., dissipated), such as inside a respective cryogenic chamber.

The waveform generator 110, such as in combination with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 and/or quantum processor 106 can be contained in a cryogenic environment, such as generated by a cryogenic chamber 116, such as a dilution refrigerator. The semiconductor device 111 can thus be employed in a cryogenic environment. Indeed, a signal can be generated by the waveform generator 110 within the cryogenic chamber 116 to affect the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110, including the semiconductor device 111, also are to be constructed to perform at such cryogenic temperatures.

Turning now to FIGS. 2a to 5b, illustrated are enlarged cross-sectional views and corresponding top views of initial, intermediate and prefinal or final semiconductor structures formed during stages of fabrication methods according to embodiments of the present disclosure. Such final semiconductor structures can be employed as semiconductor device 111, as described above relative to a quantum system 101, and/or can be employed as semiconductor devices for other suitable purposes, such as signal-based or signal-generating purposes.

Figures 2A, 2B, 2C:
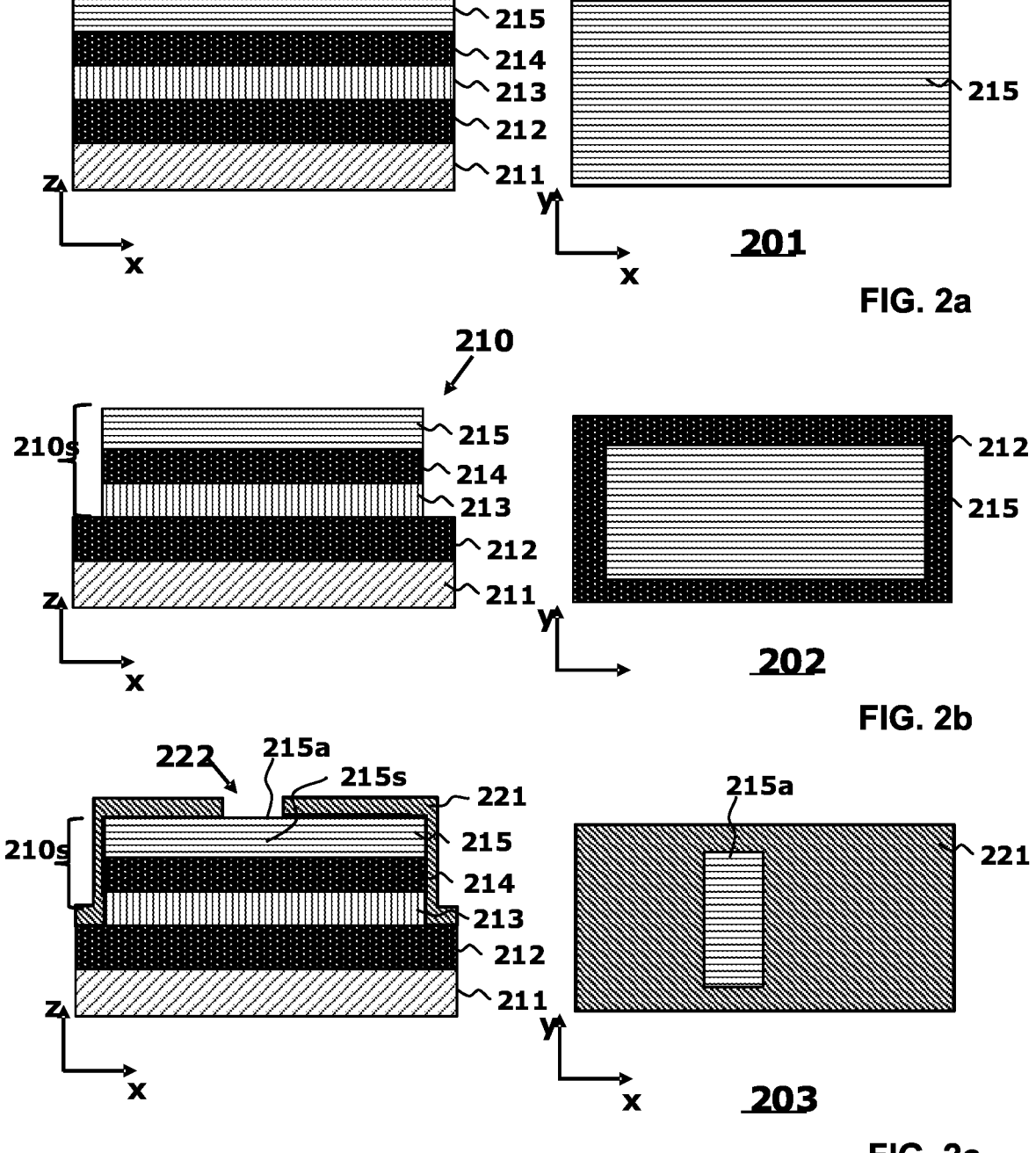
FIG. 2a shows on the left side a cross-sectional view and on the right side a corresponding top view of an initial structure or starting structure of a semiconductor device, in accordance with one or more embodiments described herein.
FIG. 2b shows on the left side a cross-sectional view and on the right side a corresponding top view of a structure which has been formed from the structure of FIG. 2a by electrically isolating the structure from other devices or other structures which may be arranged on the same substrate, in accordance with one or more embodiments described herein.
FIG. 2c shows on the left side a cross-sectional view and on the right side a corresponding top view of a structure which has been formed from the structure of FIG. 2b by encapsulating the structure with a bottom layer of a dielectric material, in accordance with one or more embodiments described herein.

FIG. 2a shows on the left side of the page a cross-sectional view and on the right side of the page a corresponding top view of an initial structure 201. The initial structure 201 can also be denoted as starting structure. The initial structure 201 can comprise a heterostructure of a high-electron mobility transistor. The initial structure 201 can be formed by molecular beam epitaxy (MBE).

The initial structure 201 can comprise a substrate 211. The substrate 211 can comprise a semiconductor material and can be, for example, a bulk semiconductor substrate. The substrate 211 can be embodied as a compound semiconductor wafer or a crystalline semiconductor wafer of a large diameter. The substrate 211 can be a III/V-substrate comprising a group III-V semiconductor material comprising a group III element and a group V element. According to embodiments, the substrate 211 can comprise indium phosphide (InP) and can thus be embodied as an InP-substrate.

According to one or more other embodiments, the substrate 211 can comprise a material from group IV of the periodic table as semiconductor material. Materials of group IV can include, for example, silicon, germanium, mixed silicon and germanium, mixed silicon and carbon, mixed silicon germanium and carbon, and/or the like. For example, the substrate 211 can be a crystalline silicon wafer that is conventionally used in the semiconductor industry.

For the following exemplary description, the substrate 211 comprises InP and thus is an InP substrate. The substrate 211 is illustrated with diagonal upwards stripes.

The structure 201 further can comprise a buffer layer 212. The buffer layer 212 can comprise indium aluminum arsenide (InAlAs) and can hence be embodied as an InAlAs buffer. The buffer layer 212 is illustrated with a dotted pattern.

The structure 201 further can comprise a channel layer 213 on the buffer layer 212. The channel layer 213 can comprise a channel material which can form the channel of the high-electron mobility transistor (HEMT). The channel material can be a group III-V semiconductor material, such as indium gallium arsenide (InGaAs). Accordingly, the channel can be an InGaAs channel. InGaAs can have excellent electron mobility properties at room temperature as well as at cryogenic temperatures. Hence it can provide advantageous channel properties and corresponding advantageous device performance. The channel layer 213 is illustrated with a pattern comprising vertical stripes.

The structure 201 further can comprise a barrier layer 214 on the channel layer 213. The barrier layer 214 can comprise a barrier material which can form a barrier of the high-electron mobility transistor (HEMT). The barrier material can be a group III-V semiconductor material, such as InAlAs. Accordingly, the barrier can be a InAlAs barrier. The barrier layer 214 can be configured to prevent large currents from flowing through the gate and to limit tunneling to the channel layer 213. The barrier layer 214 is illustrated with a dotted pattern.

The structure 201 further can comprise a cap layer 215 on the barrier layer 214. The cap layer 215 can comprise a cap material which can form a cap of the high-electron mobility transistor. The cap material can be a group III-V semiconductor material, such as InGaAs. Accordingly, the cap can be an InGaAs cap. The cap layer 215 can be embodied as highly n-doped cap layer. This can help to minimize the contact resistance of the source and drain contacts (to be fabricated subsequently). The cap layer 215 can also protect the barrier layer 214 from oxidation. The cap layer 215 is illustrated with a pattern comprising horizontal stripes.

The cap layer 215, the barrier layer 214 and the channel layer 213 of the heterostructure 201 can provide a plurality of transistor layers of a high-electron-mobility transistor 210 (see FIG. 2b). The plurality of transistor layers can each individually extend along the substrate 211, that is in a lateral direction (e.g., illustrated as the x-direction at FIGS. 2a-2c). The plurality of transistor layers can be arranged on top of one other in a stacked arrangement, and hence in a vertical stack of 210s (vertical relative to a placement surface on which the substrate 211 is resting).

Turning now to FIG. 2b, shown on the left side of the page is a cross-sectional view and on the right side of the page a corresponding top view of a structure 202. The structure 202 has been formed from the structure 201 by electrically isolating the structure 201 from other devices or other structures which can be arranged on the substrate 211. The electrical isolation can be performed by wet-etching, such as by a MESA-etching process. The etching can be performed for the cap layer 215, the barrier layer 214 and the channel layer 213 of the vertical stack of 210s.

Turning now to FIG. 2c, shown on the left side of the page is a cross-sectional view and on the right side of the page a corresponding top view of a structure 203. The structure 203 has been formed from the structure 202 by encapsulating the structure 202 with a bottom layer 221 of a dielectric material. In the exemplary embodiment of FIG. 2c it is assumed that the bottom layer 221 comprises silicon dioxide ($SiO_2$). The bottom layer 221 forms a bottom of a template structure to be further formed. Accordingly, the bottom layer 221 can establish a bottom oxide layer of the template structure. The bottom layer 221 is illustrated with a pattern comprising diagonal light downwards stripes.

Furthermore, an aperture 222 has been formed in the bottom layer 221. More particularly, the $SiO_2$ of the bottom layer 221 has been etched, such as by reactive ion etching (RIE), to give access to the material of the cap layer 215. The aperture 222 comprises a bottom 215a which provides a seed surface 215a comprising the semiconductor material of the cap layer 215. Accordingly, the semiconductor material of the cap layer 215 establishes a seed structure 215s and provides a seed material for a growth process to be performed subsequently. The cap layer 215 establishes a top layer of the vertical stack of 210s of the high-electron mobility transistor 210.

Figures 3A, 3B, 3C:
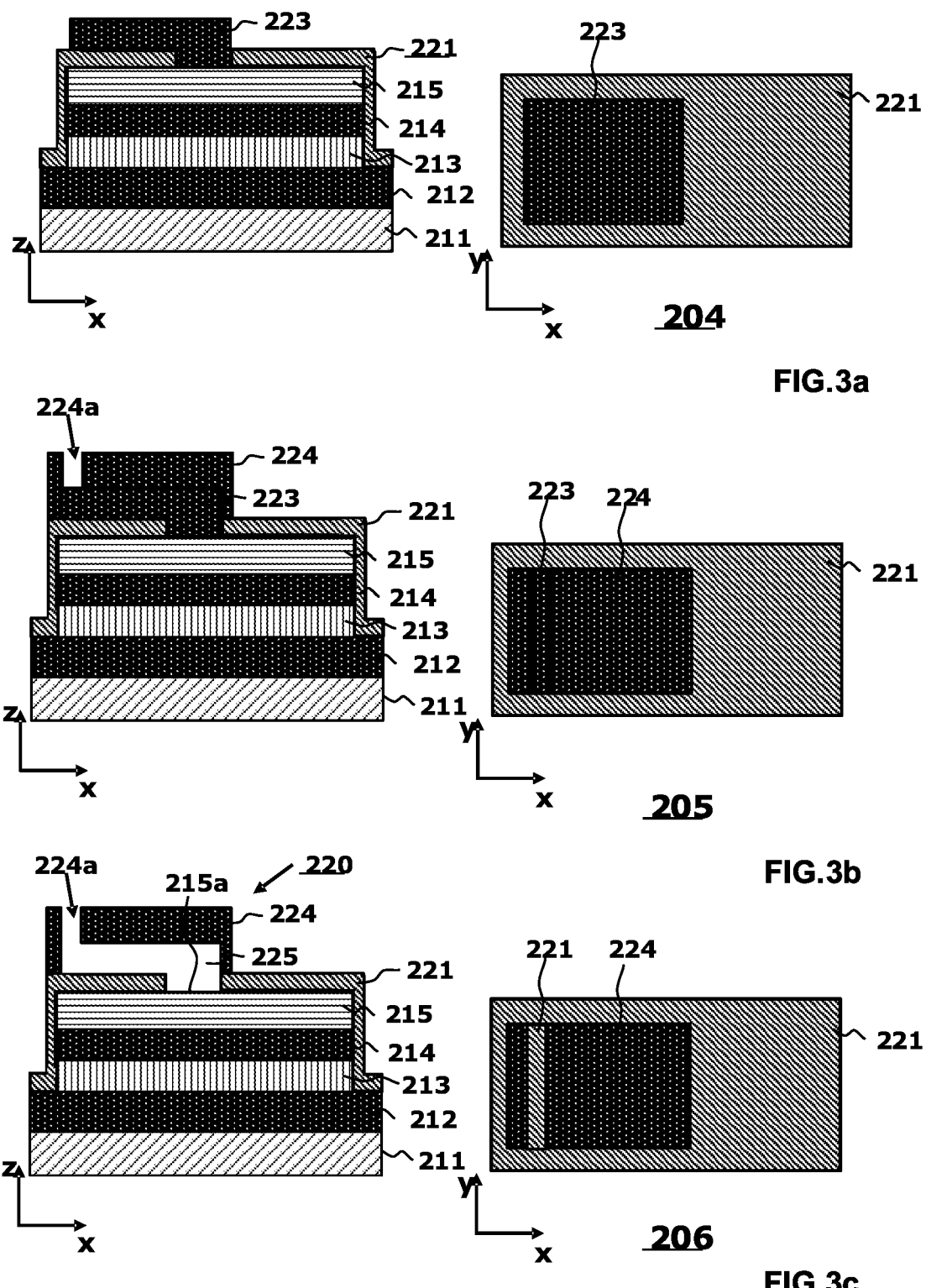
FIG. 3a shows on the left side a cross-sectional view and on the right side a corresponding top view of a structure which has been formed from the structure of FIG. 2c by forming a sacrificial layer, of starting structure of a semiconductor device, in accordance with one or more embodiments described herein.
FIG. 3b shows on the left side a cross-sectional view and on the right side a corresponding top view of a structure which has been formed from the structure of FIG. 3a by encapsulating the sacrificial structure, in accordance with one or more embodiments described herein.
FIG. 3c shows on the left side a cross-sectional view and on the right side a corresponding top view of a structure which has been formed from the structure of FIG. 3b by a selective removal of the seed material of the sacrificial structure back to a seed surface, in accordance with one or more embodiments described herein.

Next, FIG. 3a shows on the left side of the page a cross-sectional view and on the right side of the page a corresponding top view of a structure 204. The structure 204 has been formed from the structure 203 by forming a sacrificial layer 223. The sacrificial layer 223 can be formed, for example, by performing at first a spin-coating step, followed by a patterning step. The patterning of the sacrificial layer 223 can be performed, for example, by one or more lithography and etching steps. The etching can be based on HBr chemistry. Such etching can have the particular advantage that it provides smooth sidewalls.

The patterned sacrificial layer 223 can form a sacrificial structure 223. The sacrificial structure 223 can form the inner part of the template structure to be formed subsequently and is going to be replaced by one or more other semiconductor materials, such as by group III-V semiconductor materials. The sacrificial structure 223 is illustrated with a zig zag pattern.

FIG. 3b shows on the left side of the page a cross-sectional view and on the right side of the page a corresponding top view of a structure 205. The structure 205 has been formed from the structure 204 by encapsulating the sacrificial structure 223. More particularly, the sacrificial structure 223 is covered with a template layer 224 of a dielectric material. In the exemplary embodiment of FIG. 3b, it is assumed that the template layer 224 comprises $SiO_2$. Furthermore, an opening 224a has been formed in the template layer 224. More particularly, the $SiO_2$ of the template layer 224 has been etched, such as by RIE, to give access to the sacrificial material of the sacrificial structure 223. Accordingly, the template layer 224 can establish a top oxide layer of the template structure. The template layer 224 is illustrated with a pattern comprising alternating vertical lines.

FIG. 3c shows on the left side of the page a cross-sectional view and on the right side of the page a corresponding top view of a structure 206. The structure 206 has been formed from the structure 205 by a selective removal of the material of the sacrificial structure 223 back to the seed surface 215a of the cap layer 215. The selective removal has formed a hollow cavity 225 of a template structure 220 for subsequent growth steps. The selective removal can be performed by a selective etching technique. The template structure 220 comprises the opening 224a, the cavity 225, the seed surface 215a, the template layer 224 and the bottom layer 221.

Figure 4:
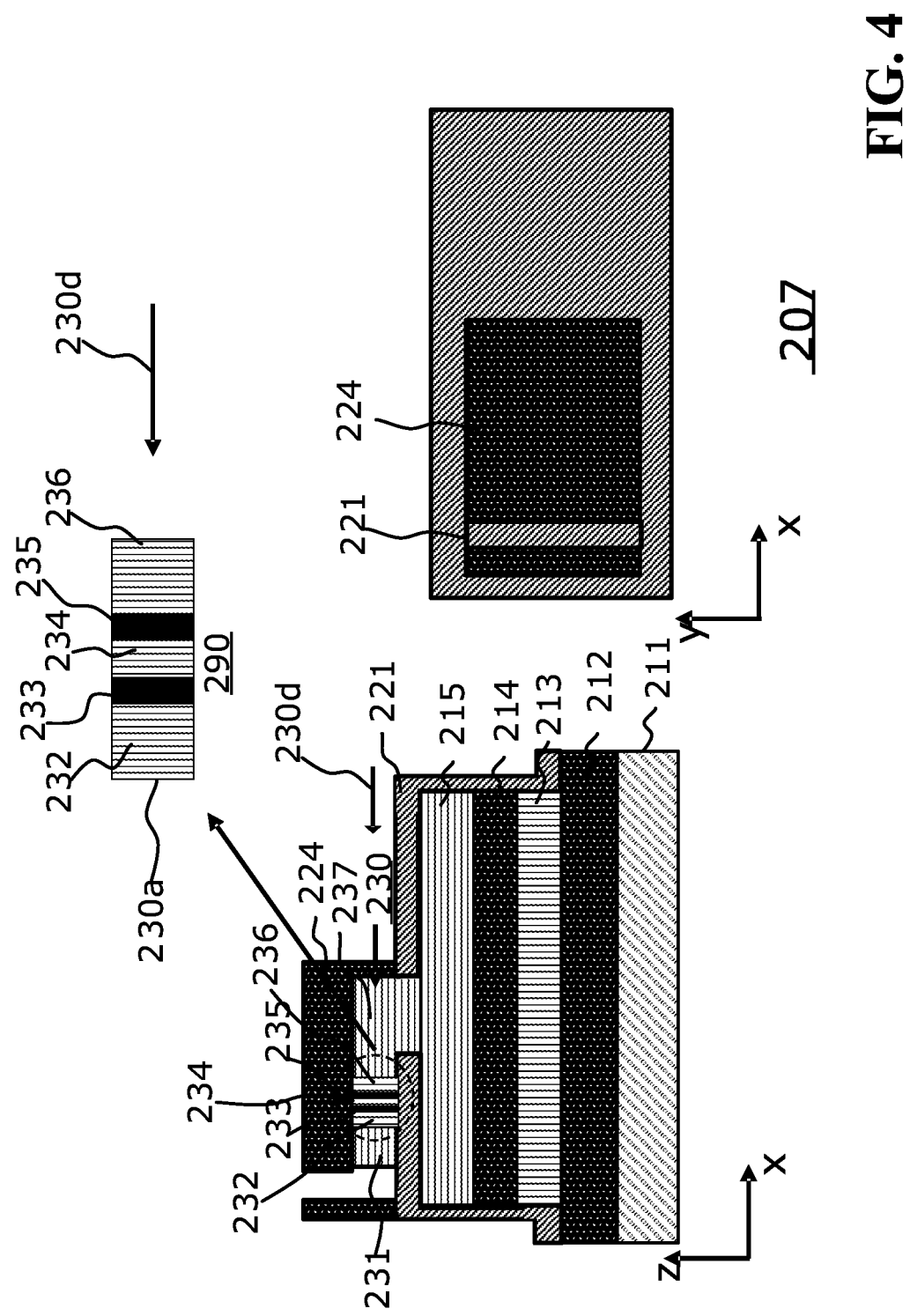
FIG. 4 shows on the left side a cross-sectional view and on the right side a corresponding top view of a structure which has been formed from the structure of FIG. 3c by growing within a template structure a semiconductor structure from the seed surface, in accordance with one or more embodiments described herein.

Turning now to FIG. 4, shown on the left side of the page is a cross-sectional view and on the right side of the page a corresponding top view of a structure 207. The structure 207 has been formed from the structure 206 by growing within the template structure 220, more particularly within the cavity 225, a semiconductor structure 230 from the seed surface 215a. The growth of the semiconductor structure 230 can comprise a nucleation phase and a growth phase of the semiconductor structure 230. The growth can be performed at first in the vertical z-direction and subsequently in a laterally-extending growth direction 230d, being parallel to the x-direction and parallel to the semiconductor substrate 211.

An exposed surface 230a of the semiconductor structure 230 can establish a front surface 230a during the growth of the semiconductor structure 230.

The semiconductor structure 230 can comprise one or more group III-V semiconductor materials. In one or more embodiments, the periodic group III-V semiconductor materials can comprise undoped and/or doped indium gallium arsenide (InGaAs), aluminum arsenide (AlAs), gallium arsenide (GaAs), indium arsenide (InAs), indium aluminum arsenide (InAlAs), and/or indium phosphide (InP).

The growing of the semiconductor structure 130 can be performed, for example, by metal organic chemical vapor deposition (MOCVD), by atmospheric pressure CVD, by low or reduced pressure CVD, by ultra-high vacuum CVD, by molecular beam epitaxy (MBE), by atomic layer deposition (ALD) and/or by hydride vapor phase epitaxy.

The semiconductor structure 230 can comprise an arrangement having a plurality of layers, such as a plurality of diode layers. The plurality of diode layers can be arranged next to one another along the substrate 211 (e.g., sequentially arranged next to one another in the laterally-extending growth direction 230d. Put another way, transition between the layers can be in the laterally-extending growth direction 230d. Indeed, the layers can be arranged next to one another, such that the full structure 230 can laterally-extend along the substrate 211. The plurality of diode layers can comprise a plurality of diode layers of a resonant tunneling diode (230).

More particularly, the semiconductor structure 230 can comprise a collector layer 231, a barrier layer 232, a first quantum well layer 233, a barrier layer 234, a second quantum well layer 235, a barrier layer 236 and an emitter layer 237.

The collector layer 231, the barrier layer 232, the first quantum well layer 233, the barrier layer 234, the second quantum well layer 235, the barrier layer 236 and the emitter layer 237 establish the diode layers of the resonant tunneling diode. Accordingly, the semiconductor structure 230 can thus form a resonant tunneling diode 230.

The structure comprising the barrier layers 232, 234 and 236, the first quantum well layer 233 and the second quantum well layer 235 also are shown in an enlarged view 290.

The collector layer 231 is illustrated with a pattern comprising horizontal stripes, the barrier layer 232 with a pattern comprising vertical stripes, the first quantum well layer 233 with a black color, the barrier layer 234 with a pattern comprising vertical stripes, the second quantum well layer 235 with a black color, the barrier layer 236 with a pattern comprising vertical stripes and the emitter layer 237 with a pattern comprising horizontal stripes.

The resonant tunneling diode 230 and/or the high-electron mobility transistor 210 can be implemented by using group III-V semiconductor materials. More particularly, the high-electron mobility transistor 210 can be a III-V field effect transistor comprising group III-V semiconductor materials and the resonant tunneling diode 230 can be a III-V resonant tunneling diode comprising group III-V semiconductor materials.

In one or more embodiments, the periodic group III-V semiconductor materials can comprise n-doped and/or p-doped layers. As used herein, doping can be understood as intentional introduction of impurities into an intrinsic semiconductor for the purpose of modulating electrical, optical and/or structural properties of the semiconductor. Doping a semiconductor can introduce allowed energy states within the band gap, but very close to the energy band, such as equal to or within 10 meV, that can correspond to the dopant type. Positive or p-type doping can introduce free holes in the valence band, whereas negative or n-type doping can introduce free electrons within the conduction band.

The introduction of dopants can have an effect of shifting conduction and valence energy bands relative to the Fermi level. In an n-type semiconductor, the Fermi level is close to the conductance band or within the conductance band in a degenerate n-type semiconductor. For a p-type semiconductor, the Fermi level is close to the or within the Valance band. Doping densities in typically doped semiconductors can range from about $5 \times 10^{18}$ cm-3 to about $10^{20}$ cm$^{-3}$, depending on the material and density of states. Whereas semiconductors can be rarely perfectly intrinsic, intrinsic in the electrical sense can mean that semiconductors are not conductive. Typically, the doping level can be about $10^{15}$ to about $10^{16}$ cm$^{-3}$.

In one or more embodiments, the periodic group III-V semiconductor materials can comprise undoped and/or doped indium gallium arsenide (InGaAs), aluminum arsenide (AlAs), gallium arsenide (GaAs), indium arsenide (InAs), indium aluminum arsenide (InAlAs) and/or indium phosphide (InP).

According to one or more embodiments, the collector layer 231 can comprise negatively doped InGaAs, the barrier layers 232, 234 and/or 236 can comprise undoped InGaAs, the first quantum well layer 233 and/or the second quantum well layer 235 can comprise AlAs, and/or the emitter layer 237 can comprise negatively doped InGaAs.

According to one or more embodiments, the chosen pattern fill of the respective layer can indicate a corresponding material of the layer. In this respect, the pattern with diagonal upwards stripes of the substrate 211 can indicate InP, the dotted pattern of the buffer layer 212 and the barrier layer 214 can indicate InAlAs, the pattern comprising horizontal stripes of the cap layer 215, the collector layer 231 and the emitter layer 237 can indicate negatively doped InGaAs, the pattern comprising vertical stripes of the barrier layers 232, 234 and 236 and the channel layer 213 can indicate undoped InGaAs and the black color of the first quantum well layer 133 and the second quantum well layer 135 can indicate AlAs according to embodiments.

Figure 5A:
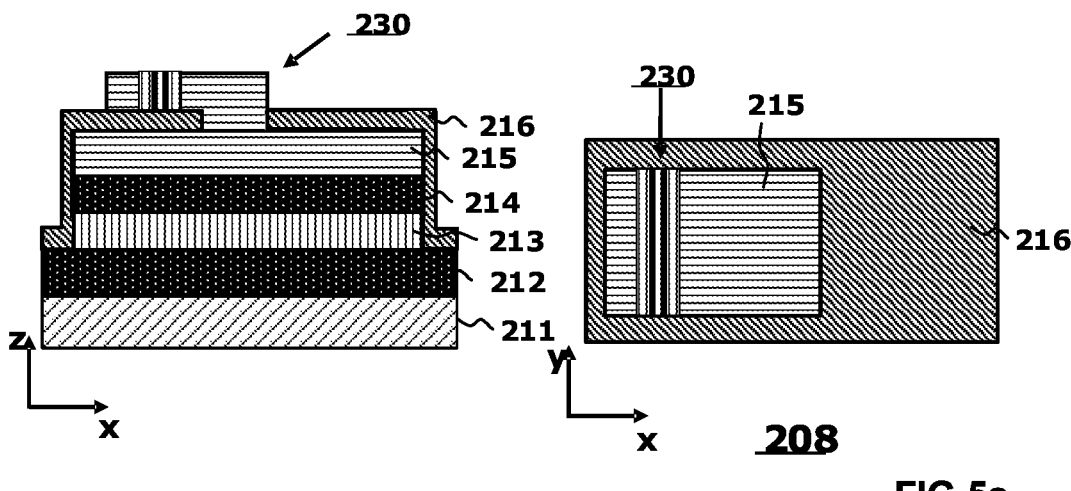
FIG. 5a shows on the left side a cross-sectional view and on the right side a corresponding top view of a semiconductor structure which has been formed from the structure of FIG. 4 by removing a template layer of the template structure, thereby releasing the semiconductor structure, in accordance with one or more embodiments described herein.

FIG. 5a shows on the left side of the page a cross-sectional view and on the right side of the page a corresponding top view of a structure 208. The structure 208 can be formed from the structure 207 by removing the template layer 224 (FIG. 4), such as by suitable etching techniques. This can release the semiconductor structure 230 forming the resonant tunneling diode 230.

The structure 208 can then be further processed in view of the envisaged application of a respective final device, such as by providing electrical contacts.

Figure 5B:
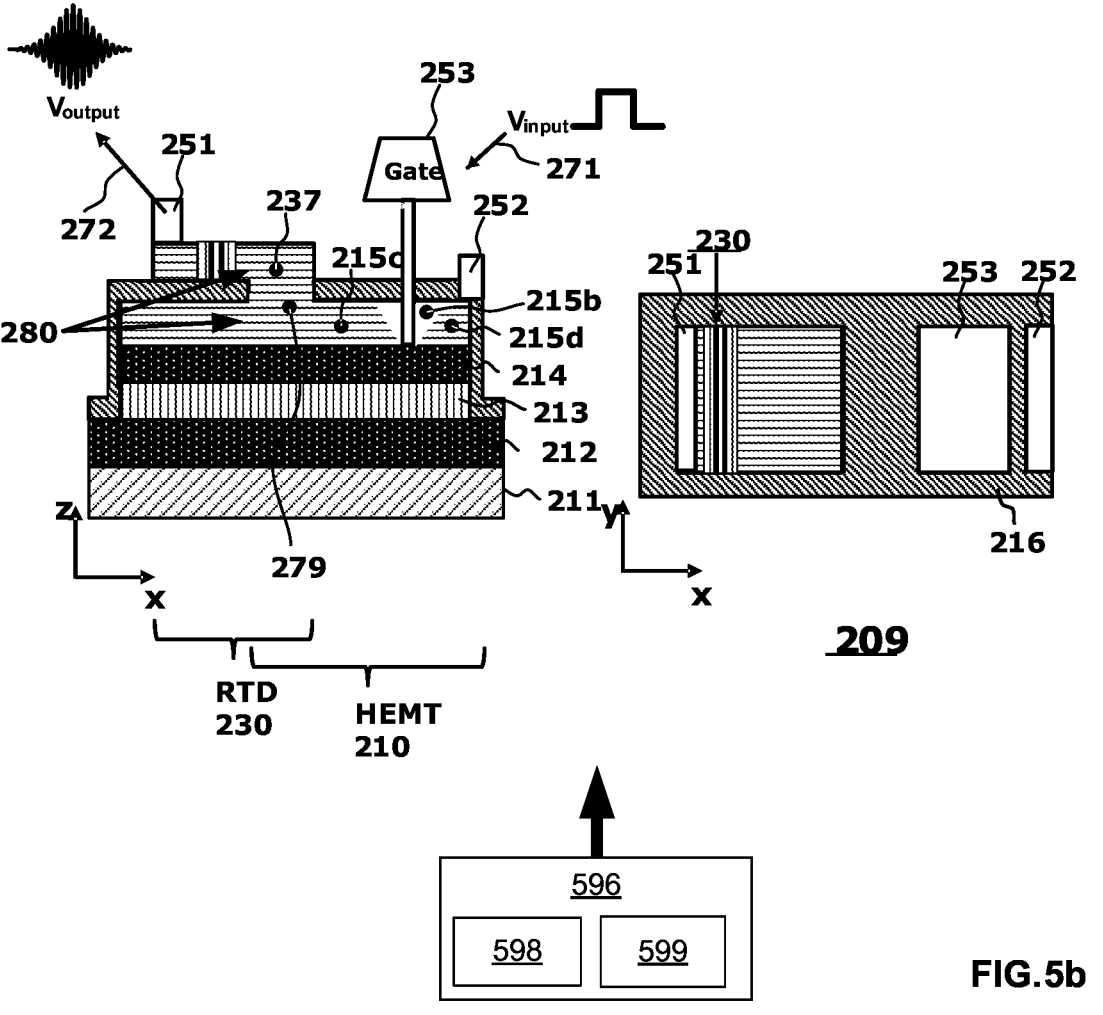
FIG. 5b shows on the left side a cross-sectional view and on the right side a corresponding top view of a semiconductor structure which has been formed from the semiconductor structure of FIG. 5a by providing or defining contacts, in accordance with one or more embodiments described herein.

FIG. 5b shows on the left side a cross-sectional view and on the right side a corresponding top view of a structure 209. The structure 209 has been formed from the structure 208 by providing or defining contacts. More particularly, a contact layer 251 has been formed on the collector layer 231 and a contact layer 252 has been formed on the cap layer 215. The contact layer 251 and the contact layer 252 can comprise a metal and can be formed by metal deposition techniques.

Furthermore, a T-gate structure 253 can be formed on the barrier layer 214. The form of the T-gate structure 253 can be configured to minimize the gate resistance. In an embodiment, this can be achieved by enlarging the cross section (e.g., vertically or z-direction) while maintaining the previous foot-print of the barrier layer 214.

The T-gate structure 253 can be formed, for example, by one or more lithography and etching steps, followed by a metal deposition technique. The etching has formed a recess 215b in the cap layer 215 which is used for contacting the barrier layer 214 by means of the T-gate structure 253.

By forming the recess 215b in the cap layer 215, a source cap layer 215c and a drain cap layer 215d can be formed.

As a result of the fabrication steps as described with reference to FIGS. 2a-5b, the resonant tunneling diode (RTD) 230 and the high-electron-mobility transistor (HEMT) 210 can be co-integrated on the substrate 211. Accordingly, the substrate 211 can be a common substrate for the resonant tunneling diode 230 and for the high-electron-mobility transistor 210 in the stacked arrangement.

According to one or more embodiments described herein, (e.g., FIG. 5b) the emitter layer 237 and the source cap layer 215c can establish a shared component 279 that at least partially defines a shared layer 280, and thus the RTD 230 and HEMT 210 can alternatively be at least partially co-integrated at a shared layer 280 at the substrate 211. This shared layer 280, as illustrated, extends in the laterally-extending direction 230d along the substrate. This shared layer 280 can be denoted as first diode layer of the resonant tunneling diode 230 and as first transistor layer of the high-electron mobility transistor 210. The shared layer 280 can comprise one or more same materials for both respective RTD and HEMT portions, such as a group III-V semiconductor material, such as InGaAs. In one or more other embodiments, one or more such same materials can comprise undoped and/or doped indium gallium arsenide (InGaAs), aluminum arsenide (AIAs), gallium arsenide (GaAs), indium arsenide (InAs), indium aluminum arsenide (InAlAs) and/or indium phosphide (InP).

According to one or more embodiments described herein, the diode layer 237 can be embodied as collector layer. According to further embodiments, the transistor layer 215c can be embodied as drain cap layer. Hence according to further embodiments, the shared layer 280 can comprise a drain cap layer of the high-electron mobility transistor 210. Furthermore, the shared layer 280 can comprise a collector layer of the resonant tunneling diode 230.

According to one or more embodiments described herein, the structure 209 can be passivated, such as by providing insulating layers. Such insulating layers have not been shown in FIG. 5b for ease of illustration.

According to one or more embodiments described herein, the semiconductor device can be configured to generate pulses, such as wavelets as qubit control pulses for a quantum computer.

According to one or more embodiments described herein, the structure 209 can be operated as follows:

The T-gate structure 253 can receive input pulses, such as rectangular input pulses 271. The semiconductor structure 209 can be then configured to generate in response output pulses at the contact layer 251, such as wavelets 272.

In one or more of the aforedescribed semiconductor device embodiments, the fabricated semiconductor structure can comprise a gain structure. Such a gain structure can be epitaxially grown and can extend in a laterally-extending direction of the substrate (e.g., 230d), more particularly in the x-y-plane. The x-y-plane can be arranged in parallel to the underlying substrate. The embodied gain structure can include a doping profile which can form a p-i-n-structure. A p-i-n-structure is a structure having an intrinsic region arranged between a p-doped region and a n-doped region.

As used herein, doping can be understood as intentional introduction of impurities into an intrinsic semiconductor for the purpose of modulating electrical, optical and/or structural properties of the semiconductor. Doping a semiconductor can introduce allowed energy states within the band gap, but very close to the energy band, such as equal to or within 10 meV, that can correspond to the dopant type. Positive or p-type doping can introduce free holes in the valence band, whereas negative or n-type doping can introduce free electrons within the conduction band.

The introduction of dopants can have an effect of shifting conduction and valence energy bands relative to the Fermi level. In an n-type semiconductor, the Fermi level is close to the conductance band or within the conductance band in a degenerate n-type semiconductor. For a p-type semiconductor, the Fermi level is close to the or within the Valance band. Doping densities in typically doped semiconductors can range from about $5 \times 10^{18}$ cm-3 to about $10^{20}$ cm$^{-3}$, depending on the material and density of states. Whereas semiconductors can be rarely perfectly intrinsic, intrinsic in the electrical sense can mean that semiconductors are not conductive. Typically, the doping level can be about $10^{15}$ to about $10^{16}$ cm$^{-3}$.

Also as shown at FIG. 5b, but described relative to any of FIGS. 2a-5b, in one or more embodiments, one or more operations for fabricating the one or more semiconductor devices described herein, such as the semiconductor device 209, can be performed by a manufacturing system, such as a manufacturing system 596 comprising one or more manufacturing devices 598, where the manufacturing system 596 is operatively coupled to a processor 599 for at least partially controlling the one or more operations. The processor 599 can be any suitable processor. Discussion proved below with respect to processor 806 can be at least partially equally applicable to the processor 599.

In one or more embodiments, the manufacturing system 596 can be configured, such as by one or more operations performed by one or more of the manufacturing devices 598 in view of one or more instructions provided by the processor 599, to construct the semiconductor device 209, such as relative to a substrate. The manufacturing devices 598 can, perform, among other operations, one or more deposition, transfer, etching, cutting, placement, removal, radiation, irradiation, adhesive and/or metallization operations.

Figure 6:
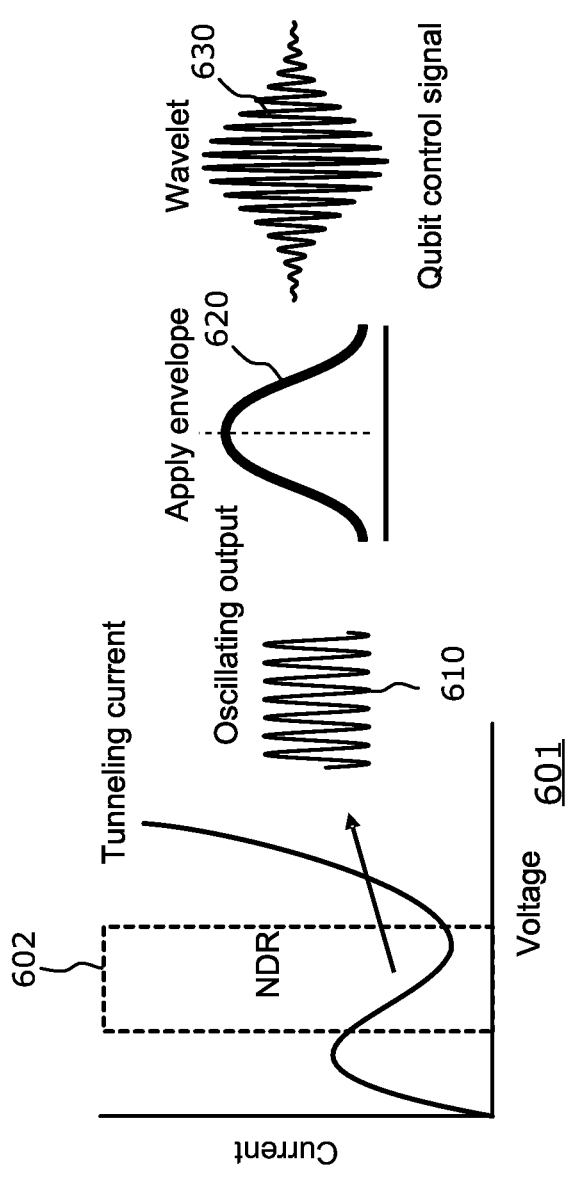
FIG. 6 illustrates the functionality of a semiconductor device, in accordance with one or more embodiments described herein.

FIG. 6 illustrates the functionality of semiconductor devices according to one or more embodiments described herein which are configured as pulse generators, such as wavelet generators, in more detail.

For example, FIG. 6 shows a voltage-current characteristic 601 of a resonant tunneling diode according to one or more embodiments described herein. The voltage-current characteristic 601 of the resonant tunneling diode has an area 602 with a negative differential resistance (NDR). Such a characteristic of a resonant tunneling diode can be used to generate an oscillating output signal 610. By applying an envelope 620 to the oscillating output 610 of the resonant tunneling diode, a wavelet 630 can be generated which can be used as qubit control pulse. The envelope 620 can be Gaussian or also arbitrary. A frequency of the wavelets 630 can be in the range between about 4 GHz and about 20 GHz and the corresponding pulse can have a length between about 20 ns and about 100 ns. To achieve short-pulse high-frequency oscillations, a low-parasitic integrated circuit can be used.

Next, FIG. 7 illustrates a flow diagram of an example, non-limiting method 700 that can facilitate a process to fabricate a semiconductor device, such as the semiconductor devices 209 of FIG. 5*b*. While the non-limiting method 600 is described relative to the semiconductor device 209 of FIG. 5*b*, the non-limiting method 600 can be applicable also to other systems and/or devices described herein, such as the semiconductor device 208 of FIG. 5*a*. Repetitive description of like elements and/or processes employed in respective embodiments is omitted for sake of brevity.

At 704, the non-limiting method 700 can comprise providing a heterostructure comprising a plurality of transistor layers of a high-electron-mobility transistor (HEMT).

At 706, the non-limiting method 700 can comprise forming on the vertical stack a template structure comprising an opening, a cavity and a seed structure, the seed structure comprising a seed material and a seed surface.

At 708, the non-limiting method 700 can comprise forming a dielectric mask on the top layer. The dielectric mask can comprise an aperture exposing the seed structure.

At 710, the non-limiting method 700 can comprise forming a sacrificial layer on the dielectric mask and the aperture.

At 712, the non-limiting method 700 can comprise forming a template layer on the sacrificial layer and forming the opening in the template layer.

At 714, the non-limiting method 700 can comprise selectively removing material of the sacrificial layer, thereby forming the cavity.

At 716, the non-limiting method 700 can comprise growing a plurality of diode layers of a resonant tunneling diode (RTD) within the cavity of the template structure from the seed surface, wherein the RTD and HEMT are co-integrated along a substrate.

At 718, the non-limiting method 700 can comprise growing the emitter layer of the resonant tunneling diode from the seed surface provided by the cap layer.

At 720, the non-limiting method 700 can comprise sequentially growing the plurality of diode layers.

At 722, the non-limiting method 700 can comprise performing further processing steps for finalizing the semiconductor device, such as a step of fabricating contact layers for contacting the semiconductor structure.

At 724, the non-limiting method 700 can comprise performing further processing steps for finalizing the semiconductor device, such as a step of passivation of the semiconductor device can be performed.

In general, the versatility of fabrication methods according to embodiments described herein can allow any combination of group III-V semiconductor materials to grow in the template structure, including embedded quantum wells, quantum dots, quantum wires, doped and/or intrinsic semiconductor layers as well as heterojunctions.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures can be preferably crystalline seed surfaces, but can according to other embodiments additionally and/or alternatively be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous and/or has an undefined crystal orientation, the growing crystal can be single crystalline but its crystal orientation can be random.

The disclosed semiconductor structures and/or circuits can be part of a semiconductor chip. The resulting integrated circuit chips can be distributed by the fabricator in raw wafer form (that is, as a single wafer that has multiple unpackaged chips), as a bare die, or in a packaged form. In the latter case, the chip can be mounted in a single chip package (such as a plastic carrier, with leads that are affixed to a motherboard or other higher level carrier) or in a multichip package (such as a ceramic carrier that has either or both surface interconnections or buried interconnections). In any case, the chip can be integrated with other chips, discrete circuit elements and/or other signal processing devices as part of either an intermediate product, such as a motherboard, and/or an end product. The end product can be any product that can include one or more integrated circuit chips.

In summary, one or more devices and/or methods provided herein relate to a method for fabricating a semiconductor device having a co-integrated RTD and HEMT. A semiconductor device can comprise an RTD and an HEMT that are co-integrated along a substrate. A fabrication method can comprise providing a heterostructure comprising a plurality of transistor layers of an HEMT, forming on the vertical stack a template structure comprising an opening, a cavity and a seed structure, the seed structure comprising a seed material and a seed surface, and growing a plurality of diode layers of an RTD within the cavity of the template structure from the seed surface, wherein the RTD and HEMT are co-integrated along a substrate.

An advantage of the aforementioned device, system and/or method can be provision of power efficiency benefits. For example, such semiconductor device can employ less power than a conventional arbitrary waveform generator (AWG) to generate a control pulse for a qubit, such as employing about $10^4$ or even about $10^5$ lower power than a conventional AWG. Such semiconductor device can employ less power than a conventional Si CMOS solution to generate a control pulse for a qubit, such as employing about 5 times to about 10 times lower power than a conventional Si CMOS solution. Such benefits can be born from a tight co-integration on a chip level between the RTD and InP HEMT elements.

In addition, the RTD structure can be grown directly on a HEMT heterostructure, such as an InP heterostructure. That is, fabrication can be made more efficient where a single growth step can be employed for the RTD structure.

In view of the one or more embodiments described herein, a practical application of the devices described herein can be ability to generate a signal to affect a qubit by employing low power. Such is a useful and practical application of computers, thus facilitating enhanced (e.g., improved and/or optimized) operation of the employed qubits, such as within a quantum logic circuit having high numbers of qubits, such as about 1000 qubits, or more. These enhancements can be due to close co-integration of an RTD and HEMT in a semiconductor device generating such signal. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a real-world qubit state of one or more qubits, such as superconducting qubits, of the quantum system. For example, a semiconductor device described herein can generate a signal or waveform to facilitate the readout from and/or relative to a quantum processor, and thus from the one or more qubits.

Moreover, a device and/or method described herein can be implemented in one or more domains, such as quantum domains, to enable scaled quantum program executions. Indeed, use of a device as described herein can be scalable, such as where a semiconductor device described herein can be employed in quantity to control and/or affect the same quantity or greater of qubits of a multi-qubit system. Thus, increased scaling of qubits provided in a cryogenic chamber can be enabled with less concern for available power input and power dissipation.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to generation of a waveform, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively fabricate a semiconductor or generate a signal pulse as the one or more embodiments described herein can facilitate this process. And, neither can the human mind nor a human with pen and paper fabricate a semiconductor or generate a signal pulse, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 9:
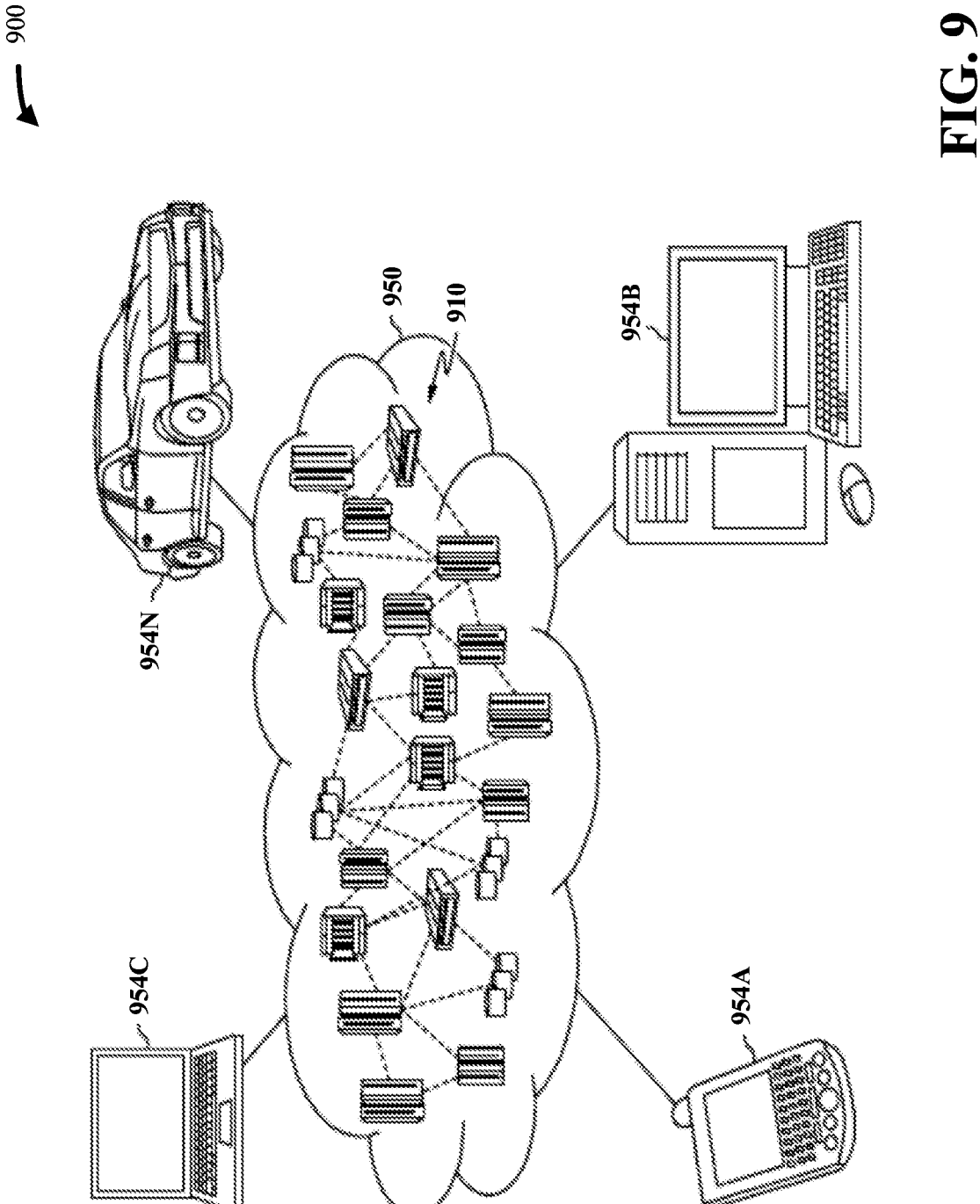
FIG. 9 illustrates a block diagram of an example, non-limiting, cloud computing environment in accordance with one or more embodiments described herein.
Figure 10:
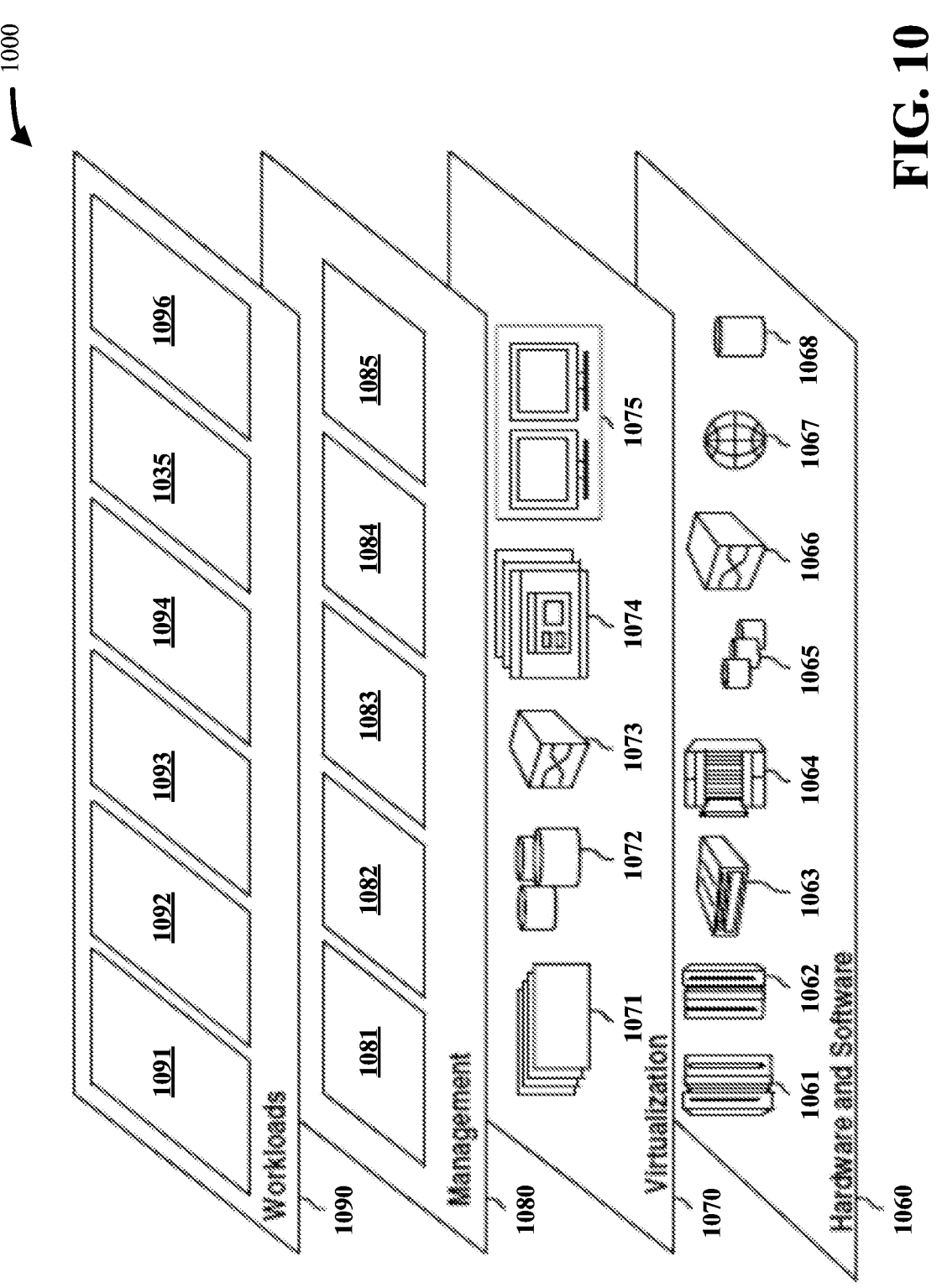
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 which can be comprised by, be associated with and/or be coupled to one or more computer and/or computing-based elements described herein with reference to FIG. 1. For example, such suitable operating environment 800 can, in one or more embodiments, obtain and/or transmit a quantum job request (e.g., quantum job request 104) to the quantum system 101, manage a quantum job queue, and/or manage one or more classical operations in conjunction with the quantum system 101. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 can comprise a computer 802, the computer 802 including a processing unit 806, a system memory 804 and/or a system bus 808.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid-state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid-state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a pre-defined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to the illustration 900 of FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. One or more, if not all aspects of the one or more embodiments described herein can be practiced on stand-alone computers. In a distributed computing environment, program modules can be located in local and/or remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and/or techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A semiconductor device comprising:
a substrate;
a buffer layer on the substrate; and
a resonant tunneling diode (RTD) and a high-electron-mobility transistor (HEMT) that are co-integrated along the substrate,
wherein the RTD is directly adjacent to the HEMT,
wherein the HEMT comprises a first group of layers stacked on the buffer layer,
wherein the first group of layers comprise a channel layer, a barrier layer, a source cap layer and a drain cap layer,
wherein the first group of layers is stacked vertically in a normal direction from a surface of the buffer layer, and
wherein the RTD comprises a second group of layers stacked on a dielectric layer that is parallel to the surface of the buffer layer,
wherein the second group of layers is not in direct contact with the channel layer and the barrier layer,
wherein the second group of layers is stacked horizontally in a parallel direction to the surface of the buffer layer,
wherein a layer at one end of the first group of layers of the HEMT is directly adjacent to a layer at one end of the second group of layers of the RTD, and
wherein the dielectric layer is directly adjacent to the layer at the one end of the first group of layers of the HEMT.

2. The semiconductor device according to claim 1, wherein the second group of layers comprise a collector layer, a first quantum well layer, a second quantum well layer and an emitter layer.

3. The semiconductor device according to claim 2, wherein the layer at the one end of the second group of layers of the RTD is the emitter layer or the collector layer of the RTD.

4. The semiconductor device according to claim 2, wherein the barrier layer is a first barrier layer, and wherein the second group of layers further comprise a second barrier layer between the first quantum well layer and the second quantum well layer.

5. The semiconductor device according to claim 4, wherein the second group of layers further comprise a third barrier layer between the first quantum well layer and the emitter layer.

6. The semiconductor device according to claim 4, wherein the second group of layers further comprise a third barrier layer between the first quantum well layer and the collector layer.

7. The semiconductor device according to claim 2, wherein the barrier layer is a first barrier layer, and wherein the second group of layers further comprise a second barrier layer between the first quantum well layer and the second quantum well layer, a third barrier layer between the first quantum well layer and the collector layer, and fourth barrier layer between the second quantum well layer and the emitter layer.

8. The semiconductor device according to claim 1, wherein the layer at the one end of the first group of layers of the HEMT is the drain cap layer or the source cap layer of the HEMT.

9. The semiconductor device according to claim 1, wherein the semiconductor device is configured to generate a signal pulse as a qubit control pulse.

10. The semiconductor device according to claim 1, wherein the HEMT is a III-V compound transistor comprising a periodic group III-V semiconductor material, and wherein the periodic group III-V semiconductor material comprises a periodic group III element and a periodic group V element.

11. The semiconductor device according to claim 1, wherein the RTD is a III-V resonant tunneling diode comprising a periodic group III-V semiconductor material, and wherein the periodic group III-V semiconductor material comprises a periodic group III element and a periodic group V element.

12. The semiconductor device according to claim 1, wherein the substrate is a III/V-substrate.

13. The semiconductor device according to claim 1, wherein the semiconductor device is arranged inside a cryostat of a quantum computer.

14. The semiconductor device according to claim 1, wherein the dielectric layer comprises silicon dioxide.

15. The semiconductor device according to claim 1, wherein the buffer layer comprises indium aluminum arsenide.

16. The semiconductor device according to claim 1, wherein the channel layer is in direct contact with the buffer layer.

17. The semiconductor device according to claim 1, wherein the barrier layer is in direct contact with the channel layer.

18. The semiconductor device according to claim 1, wherein the barrier layer is in direct contact with the source cap layer and the drain cap layer.

19. The semiconductor device according to claim 1, further comprising a gate structure between the source cap layer and the drain cap layer.

20. The semiconductor device according to claim 1, further comprising a first contact layer in direct contact with the RTD, and a second contact layer in direct contact with the HEMT.

* * * * *